United States Patent [19]

Breya

[11] Patent Number: 4,696,105

[45] Date of Patent: Sep. 29, 1987

[54] MOUNTING METHOD FOR ELECTRICAL COMPONENTS HAVING CONNECTIONS BOTH ON AND OFF A CIRCUIT BOARD

[75] Inventor: Edward F. Breya, Beaverton, Oreg.

[73] Assignee: Tektronix, Inc., Beaverton, Oreg.

[21] Appl. No.: 925,849

[22] Filed: Oct. 30, 1986

[51] Int. Cl.$^4$ ............................................. H05K 3/34
[52] U.S. Cl. .................................................... 29/840
[58] Field of Search ................. 339/98, 17 B; 29/837, 29/762, 838, 839, 840, 857, 859, 860; 228/180.1

[56] References Cited

U.S. PATENT DOCUMENTS 4,373,260 2/1983 Matsumura et al. .................. 29/840

Primary Examiner—Howard N. Goldberg
Assistant Examiner—Carl J. Arbes
Attorney, Agent, or Firm—George T. Noe

[57] ABSTRACT

A method for mounting electrical components or wires having connections both on and off circuit boards is provided in which the component is machine inserted and flow soldered along with other parts. Leads to be connected off the board are inserted into dummy holes, i.e., holes having no metallic pads or plating, so that these leads are not bonded to the board during the flow solder process. In the final assembly stage, the unbonded leads are raised from the board and electrically and mechanically connected to a terminal of an offboard component.

1 Claim, 4 Drawing Figures

MOUNTING METHOD FOR ELECTRICAL COMPONENTS HAVING CONNECTIONS BOTH ON AND OFF A CIRCUIT BOARD

BACKGROUND OF THE INVENTION

This invention relates generally to the manufacture of electronic equipment having etched circuit boards, and in particular to a method of mounting components having connections both on and off a circuit board.

In the manufacture of circuit board assemblies for electronic equipment, raw circuit boards are first predrilled with holes to receive component leads and then are etched and plated using conventional circuit board fabrication processes. Components, such as resistors, capacitors, sockets, etc., are then mounted equipment which not only places each component in its proper location, but crimps the leads to temporarily hold the components in place. The circuit board, with components mounted thereon, is then flow soldered, a process in which the circuit board is placed in contact with a pool of molten solder to solder each connection at once. The completed assembly is then cleaned and thereafter ready for use.

Often in manufacturing electronic equipment having circuit board assemblies, it is necessary to do a certain amount of hand wiring in the assembly process. For example, it may be necessary to connect a wire or a resistor from the circuit board to a front panel switch or potentiometer. In hand wiring, the assembler typically must test fit the wire or component, solder one end into a hole provided in the circuit board, and then solder the other end to a lug or post provided on the off-board component. After a component has been hand-soldered to the board, it sometimes must then be hand cleaned to remove flux. In densely-packed circuit boards, it is often difficult to add hand wired components without damaging nearby circuitry. Thus, it is not only time consuming to hand insert and solder components into a circuit board, but the opportunities for inadvertently damaging a completed board are numerous.

In addition to the assembly problems attendant with hand wiring, it would be desirable to eliminate the separate handling and kitting of additional parts to be added at the final assembly stage.

SUMMARY OF THE INVENTION

In accordance with the present invention, a method for mounting electrical components or wires having connections both on and off circuit boards is provided in which the component is machine inserted and soldered along with other parts. This is achieved by providing a dummy hole to receive and hold the component lead that is to be connected to a component off the board. The dummy hole is not plated or otherwise located adjacent metallic pads or runs, and therefore the lead is not electrically or mechanically connected to the board and can later be lifted up and connected to a terminal on an off-board component.

It is therefore one object of the present invention to provide a novel method for mounting electrical components or wires having connections both on and off a circuit board.

It is another object of the present invention to reduce final assembly time where electrical components are to be connected between circuit boards and off-board components.

It is another object of the present invention to reduce damage to circuit boards in final assembly of electronic equipment.

Other objects, attainments and features of the present invention will become obvious to those having ordinary skill in the art upon a reading of the following of the description when taken in conjunction with the accompanying drawings.

THE DRAWINGS

FIGS. 1 through 4 illustrate the steps of the method in accordance with the present invention.

DETAILED DESCRIPTION OF THE INVENTION

Figure 1:
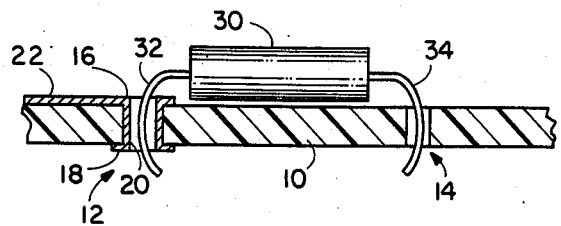

Referring now to FIG. 1, there is shown a cross section of a circuit board 10 having a first opening 12 and a second opening 14 therethrough. The first opening 12 has metallic pads 16 and 18 adjacent the opening on opposite sides of the circuit board, and the pads 16 and 18 are joined by metallic material 20 plated through the hole using conventional etched circuit board fabrication techniques. A metallic circuit run 22 is shown extending from pad 16. Note that opening 14 has no adjacent metallic material, and therefore may appropriately be referred to as a dummy hole.

A component 30 having leads 32 and 34 at opposite ends is installed on the circuit board by machine insertion equipment such that lead 32 extends through opening 12 and lead 34 extends through opening 34. The leads 32 and 34 are automatically crimped to hold component 30 on the circuit board. Component 30 may be any element capable of being machine insertable and having at least two leads or ends to be connected, such as wires or wire jumpers, resistors, capacitors, or sockets for transistors or integrated circuits. The distance between openings 12 and 14 depends on several factors, including the component length, the distance to be covered in finally connecting both ends of the component, and the insertion length capabilities of the machine insertion equipment.

After machine insertion, the circuit board is flow soldered by applying flux to the board and passing it over a pool of molten solder.

Figure 2:
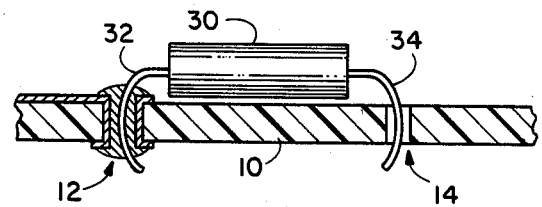

Refer to FIG. 2. The solder 40 flows into opening 12 and bonds to the metallic surfaces therein, including the outer surface of lead 32. The solder also flows into opening 14; however since there are no metallic surfaces other than lead 34, no bonding takes place. Thus, lead 32 is soldered into the opening 12 in the circuit board, while lead 34 within opening 14 is merely coated with solder or tinned.

Figure 3:
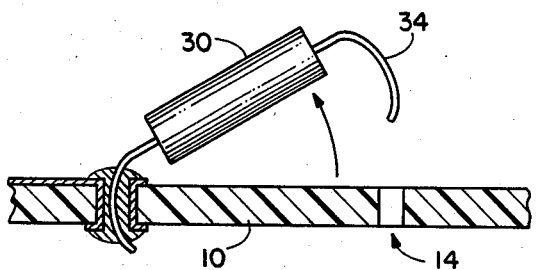
Figure 4:
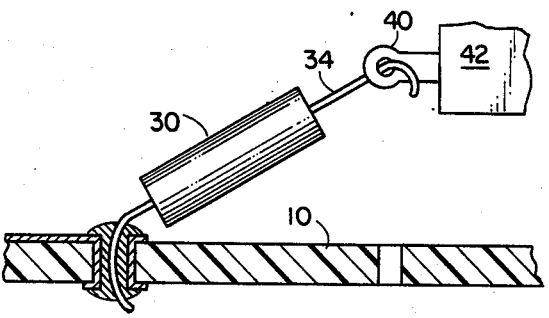

At the final assembly stage, the unbonded lead 34 is lifted out of opening 14 and appropriately manipulated to connect it to a terminal on an off-board component See FIGS. 3 and 4. Lead 34 may be suitably shaped and connected to a terminal lug 40 of an off-board component 40 and then soldered.

In summary, it can be seen that a novel method for mounting electrical components has been shown and described herein

I claim:

1. A method for mounting an electrical component having at least one connection to be made to a circuit board and at least one connection to be made to a terminal off the circuit board, comprising the steps of:

machine inserting the components such that a first lead passes through a first opening in the circuit board and a second lead passes through a second opening in the circuit board, wherein only the first opening has metallic material adjacent thereto;

flow soldering the circuit board such that the first lead is bonded to the metallic material adjacent the first opening while the second lead remains unbonded;

raising the unbonded second lead from the second opening and connecting said second lead to said terminal; and soldering said second lead to said terminal.

* * * * *